(12) United States Patent
Lin

(10) Patent No.: US 9,761,535 B1
(45) Date of Patent: Sep. 12, 2017

(54) INTERPOSER, SEMICONDUCTOR PACKAGE WITH THE SAME AND METHOD FOR PREPARING A SEMICONDUCTOR PACKAGE WITH THE SAME

(71) Applicant: NANYA TECHNOLOGY CORPORATION, Taoyuan (TW)

(72) Inventor: Po Chun Lin, Changhua (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/194,195

(22) Filed: Jun. 27, 2016

(51) Int. Cl.
*H01L 21/48* (2006.01)
*H01L 23/538* (2006.01)
*H01L 23/18* (2006.01)
*H01L 25/065* (2006.01)
*H01L 25/00* (2006.01)

(52) U.S. Cl.
CPC ........ *H01L 23/5389* (2013.01); *H01L 21/486* (2013.01); *H01L 21/4853* (2013.01); *H01L 21/4857* (2013.01); *H01L 23/18* (2013.01); *H01L 23/5383* (2013.01); *H01L 23/5384* (2013.01); *H01L 25/0657* (2013.01); *H01L 25/50* (2013.01); *H01L 2225/06513* (2013.01); *H01L 2225/06548* (2013.01); *H01L 2225/06555* (2013.01)

(58) Field of Classification Search
CPC ............... H01L 23/5389; H01L 21/486; H01L 21/4857; H01L 23/5384
See application file for complete search history.

(56) References Cited

U.S. PATENT DOCUMENTS

| | | | |
|---|---|---|---|
| 6,392,296 B1 | 5/2002 | Ahn et al. | |
| 7,842,541 B1 * | 11/2010 | Rusli | H01L 23/49833 438/106 |
| 7,851,708 B2 * | 12/2010 | Sakai | H01L 23/49822 174/255 |
| 8,119,454 B2 | 2/2012 | Jin | |
| 8,269,337 B2 | 9/2012 | Hu et al. | |
| 8,273,603 B2 | 9/2012 | Racz et al. | |

(Continued)

FOREIGN PATENT DOCUMENTS

| TW | 200711063 A | 3/2007 |
|---|---|---|
| TW | 201601248 A | 1/2016 |

*Primary Examiner* — Dung Le
(74) *Attorney, Agent, or Firm* — Muncy, Geissler, Olds & Lowe, P.C.

(57) ABSTRACT

One aspect of the present disclosure provides an interposer for a semiconductor package. The interposer includes a substrate portion and a wall portion disposed on the substrate portion. The substrate portion has a first side, a second side, and an electrical interconnect structure between the first side and the second side. The substrate portion is substantially free from conductive through vias, and the cost for fabricating through silicon vias (TSV) is very expensive; therefore, the fabrication cost of the interposer can be dramatically reduced. In addition, the wall portion is disposed on the first side and defining an aperture exposing a portion of the electrical interconnect structure. At least one semiconductor die can be bonded to the interposer and inside the aperture. Consequently, the height of the semiconductor package is lower than the design of disposing the semiconductor die on top of the interposer.

20 Claims, 22 Drawing Sheets

(56) References Cited

U.S. PATENT DOCUMENTS

| | | |
|---|---|---|
| 8,389,337 B2 | 3/2013 | Roberts et al. |
| 8,604,603 B2 | 12/2013 | Lau et al. |
| 8,946,564 B2 | 2/2015 | Hu et al. |
| 8,981,570 B2 | 3/2015 | Tseng et al. |
| 2010/0081236 A1* | 4/2010 | Yang .................... H01L 23/147 438/119 |
| 2011/0193221 A1* | 8/2011 | Hu ........................ H01L 21/563 257/737 |
| 2011/0193235 A1 | 8/2011 | Hu et al. |
| 2011/0304999 A1 | 12/2011 | Yu et al. |
| 2012/0292757 A1* | 11/2012 | Mauder ................ H01L 23/481 257/698 |
| 2013/0032390 A1* | 2/2013 | Hu ........................ H01L 23/147 174/266 |
| 2013/0082365 A1 | 4/2013 | Bernier et al. |

\* cited by examiner

INTERPOSER, SEMICONDUCTOR PACKAGE WITH THE SAME AND METHOD FOR PREPARING A SEMICONDUCTOR PACKAGE WITH THE SAME

TECHNICAL FIELD

The present disclosure relates to an interposer substantially free from conductive through vias, a semiconductor package with the same and a method for preparing a semiconductor package with the same.

DISCUSSION OF THE BACKGROUND

Packaging technology for integrated circuit (IC) structures has been continuously developed to meet the demand toward miniaturization and mounting reliability. Recently, as the miniaturization and high functionality of electric and electronic products are required, various techniques have been disclosed in the art. To increase the density of package structures, multiple dies may need to be packaged in a same package structure. To accommodate multiple semiconductor dies, an interposer is typically used to bond integrated circuit dies thereon, and the resulting structure including the interposer and the semiconductor dies are treated as a single structure.

Package technology may involve stacking multiple semiconductor dies to achieve a high level of integration in semiconductor devices. Thus, through silicon vias (hereinafter abbreviated as TSV) and interposers are used to provide electrical connections for the stacked semiconductor dies. By involving those approaches, the spacing distance between semiconductor dies is reduced and the size of the semiconductor package is shrunk while electrical performance and operation frequency of the semiconductor package are both improved.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides an interposer substantially free from conductive through vias, a semiconductor package with the same and a method for preparing a semiconductor package with the same.

One aspect of the present disclosure provides an interposer for a semiconductor package. In some embodiments, the interposer comprises a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing a portion of the electrical interconnect structure.

Another aspect of the present disclosure provides a semiconductor package. In some embodiments, the semiconductor package comprises an interposer and at least one first semiconductor die bonded to the interposer. In some embodiments, the interposer comprises a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing a portion of the electrical interconnect structure. In some embodiments, the at least one first semiconductor die is disposed in the aperture of the interposer.

In some embodiments, the interconnect structure comprises at least one first conductive terminal disposed on the first side, at least one second conductive terminal disposed on the second side, and at least one conductive line electrically connects the at least one first conductive terminal and the at least one second conductive terminal.

In some embodiments, the substrate portion and the wall portion are formed of different materials.

In some embodiments, the wall portion comprises an intervening layer disposed on the substrate portion and a stiffener disposed on the intervening layer.

In some embodiments, the interposer comprises a plurality of third conductive terminals separated by dielectric material on top of the wall portion.

In some embodiments, the wall portion has a third side above the first side of the substrate portion, and the wall portion has at least one conductive through via penetrating through the wall portion.

In some embodiments, the interposer further comprises at least one third conductive terminal disposed on the third side, and the at least one conductive through via electrically connects the at least one third conductive terminal to the interconnect structure.

In some embodiments, the semiconductor package further comprises at least one second semiconductor die bonded to the at least one third conductive terminal, and the at least one second semiconductor die is disposed above the at least one first semiconductor die.

In some embodiments, the semiconductor package further comprises an object bonded to the second side of the interposer.

Another aspect of the present disclosure provides a method for preparing a semiconductor package. In some embodiments, the method for preparing a semiconductor package comprises the steps of providing an interposer and bonding at least one first semiconductor die to the interposer. In some embodiments, the interposer comprises a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing the first side. In some embodiments, the at least one first semiconductor die is disposed in the aperture of the interposer.

In some embodiments, the step of providing an interposer comprises forming the electrical interconnect structure on a first side of the substrate portion and performing an etching process from a second side of the substrate portion to form the wall portion on the first side and defining the aperture exposing a portion of the electrical interconnect structure.

In some embodiments, the step of providing an interposer comprises forming the electrical interconnect structure on a first side of the substrate portion, thinning the substrate portion from a second side of the substrate portion to expose the electrical interconnect structure, forming an intervening layer on the second side of the substrate portion, and forming the wall portion on the intervening layer and defining the aperture exposing the first side.

In some embodiments, the step of providing an interposer comprises forming at least one conductive through via penetrating through the wall portion.

In some embodiments, the wall portion has a third side above the first side of the substrate portion, the method further comprises forming at least one third conductive terminal on the third side, bonding at least one second semiconductor die to the at least one third conductive terminal, and the at least one second semiconductor die is disposed above the at least one first semiconductor die.

In some embodiments, the method for preparing a semiconductor package further comprises bonding an object to the second side of the interposer.

In some embodiments, the semiconductor die can be embedded in the aperture of the interposer, rather than being disposed on top of the interposer. Consequently, the height of the semiconductor package is lower than the design of disposing the semiconductor die on top of the interposer, i.e., the semiconductor package has a smaller form factor. In addition, the cost for fabricating through silicon vias (TSV) is very expensive, and the fabrication of the interposer does not include forming through silicon vias (TSV); therefore, the fabrication cost of the interposer can be dramatically reduced.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to an interposer substantially free from conductive through vias, a semiconductor package with the same and a method for preparing a semiconductor package with the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
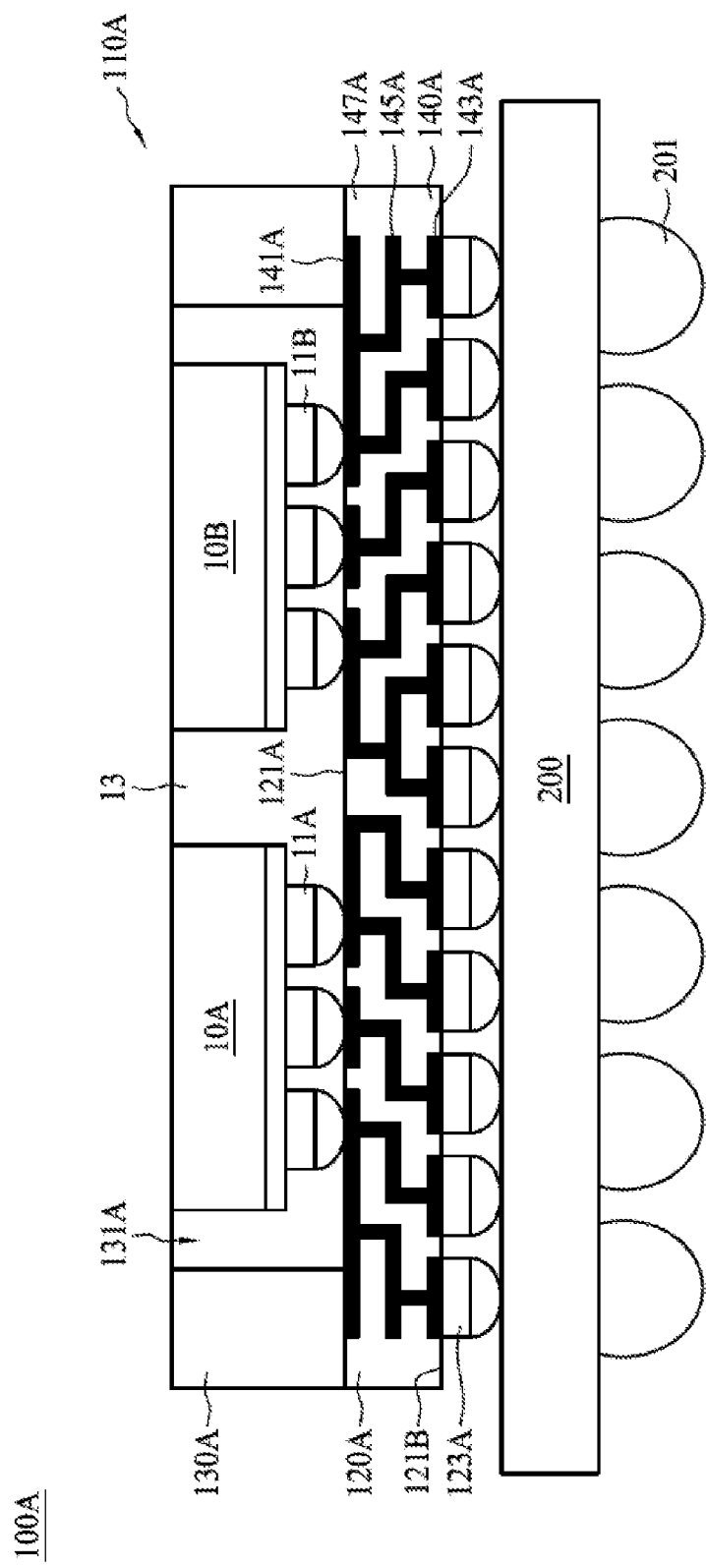
FIG. 1 is a cross-sectional view of a semiconductor package in accordance with some embodiments of the present disclosure.

FIG. 1 is a cross-sectional view of a semiconductor package 100A in accordance with some embodiments of the present disclosure. In some embodiments, the semiconductor package 100A comprises an interposer 110A, a first semiconductor die 10A and a second semiconductor die 10B bonded to a first side 121A of the interposer 110A, and an object 200 bonded to a second side 121B of the interposer 110A, wherein the first side 121A is opposite to the second side 121B. In some embodiments, the first semiconductor die 10A and the second semiconductor die 10B include integrated circuit devices, such as transistors and diodes; in addition, the first semiconductor die 10A and the second semiconductor die 10B can be the same type of semiconductor die or a different type of semiconductor die. In some embodiments, the first side 121A includes, but not limited to, the upper surface of the interposer 110A facing the semiconductor die and the space above the upper surface; similarly, the second side 121B includes, but not limited to, the lower surface of the interposer 110A facing the object 200 and the space below the lower surface.

In some embodiments, the interposer 110A comprises a substrate portion 120A and a wall portion 130A disposed on the substrate portion 120A; the substrate portion 120A has an electrical interconnect structure 140A between the first side 121A and the second side 121B, and the substrate portion 120A is substantially free from integrated circuit devices, such as transistors, diodes and conductive through vias; and the wall portion 130A is disposed on the first side 121A and defining an aperture 131A exposing a portion of the first side 121A. In some embodiments, the aperture 131A defined by the wall portion 130A is filled with a nonconductive film/paste (NCF/NCP) 13.

In some embodiments, the interconnect structure 140A comprises one or more dielectric layer 147A, at least one first conductive terminal 141A disposed on the first side 121A, at least one second conductive terminal 143A disposed on the second side 121B, and at least one conductive line 145A electrically connects the at least one first conductive terminal 141A and the at least one second conductive terminal 143A.

In some embodiments, the first semiconductor die 10A includes at least one conductive joint 11A, the second semiconductor die 10B includes at least one conductive joint 11B, and the first semiconductor die 10A and the second semiconductor die 10B are disposed in the aperture 131A of the interposer 110A, wherein the conductive joints 11A, 11B are bonded to the first conductive terminal 141A on the first side 121A in the aperture 131A. In some embodiments, the semiconductor package 100A further comprises an object 200, such as printed circuit board (PCB), with a plurality of conductive solder joints 201 or another semiconductor die bonded to the second side 121B of the interposer 110A, wherein the printed circuit board (PCB) serves as a package substrate. In some embodiments, the interposer 110A comprises a plurality of conductive joints 123A on the second side 121B, and the object 200 is bonded to the conductive joints 123A.

In some embodiments, the first semiconductor die 10A and the second semiconductor die 10B are embedded in the aperture 131A of the interposer 110A, rather than being disposed on top of the interposer 110A. Consequently, the height of the semiconductor package 100A is lower than the design of being disposed on top of the interposer 110A, i.e., the semiconductor package 100A has a smaller form factor. In addition, the cost for fabricating through silicon vias (TSV) is very expensive, and the fabrication of the interposer 110A does not include forming through silicon vias (TSV); therefore, the fabrication cost of the interposer 110A can be dramatically reduced.

Figure 2:
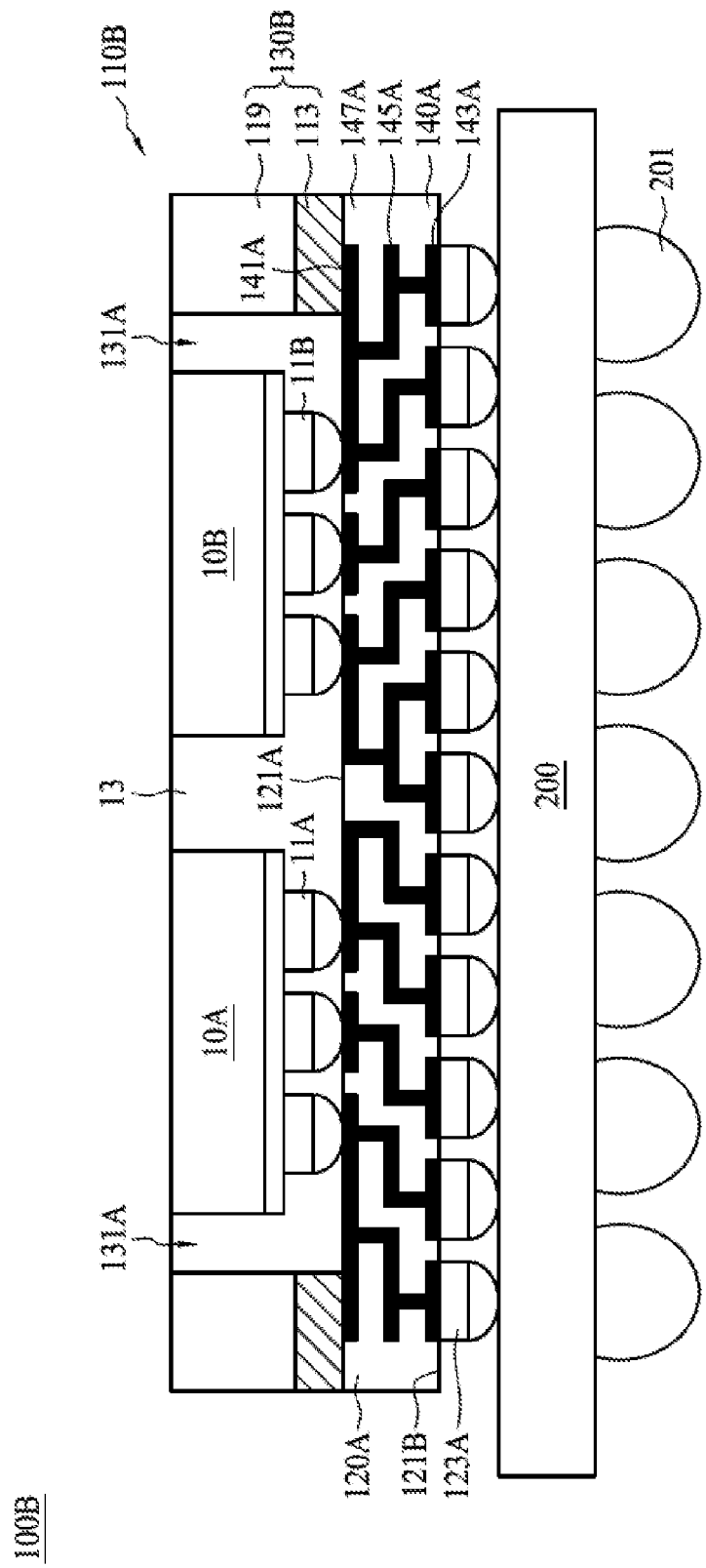
FIG. 2 is a cross-sectional view of a semiconductor package in accordance with some embodiments of the present disclosure.

FIG. 2 is a cross-sectional view of a semiconductor package 100B in accordance with some embodiments of the present disclosure. The semiconductor package 100B shown in FIG. 2 is substantially the same as the semiconductor package 100A shown in FIG. 1, except that the semiconductor package 100B comprises an interposer 110B having a wall portion 130B including an intervening layer 113 and a stiffener 119 disposed over the substrate portion 120A. In some embodiments, the intervening layer 113 is an adhesive layer formed on the electrical interconnect structure 140A, and the stiffener 119 of silicon or glass is formed on the intervening layer 113.

Figure 3:
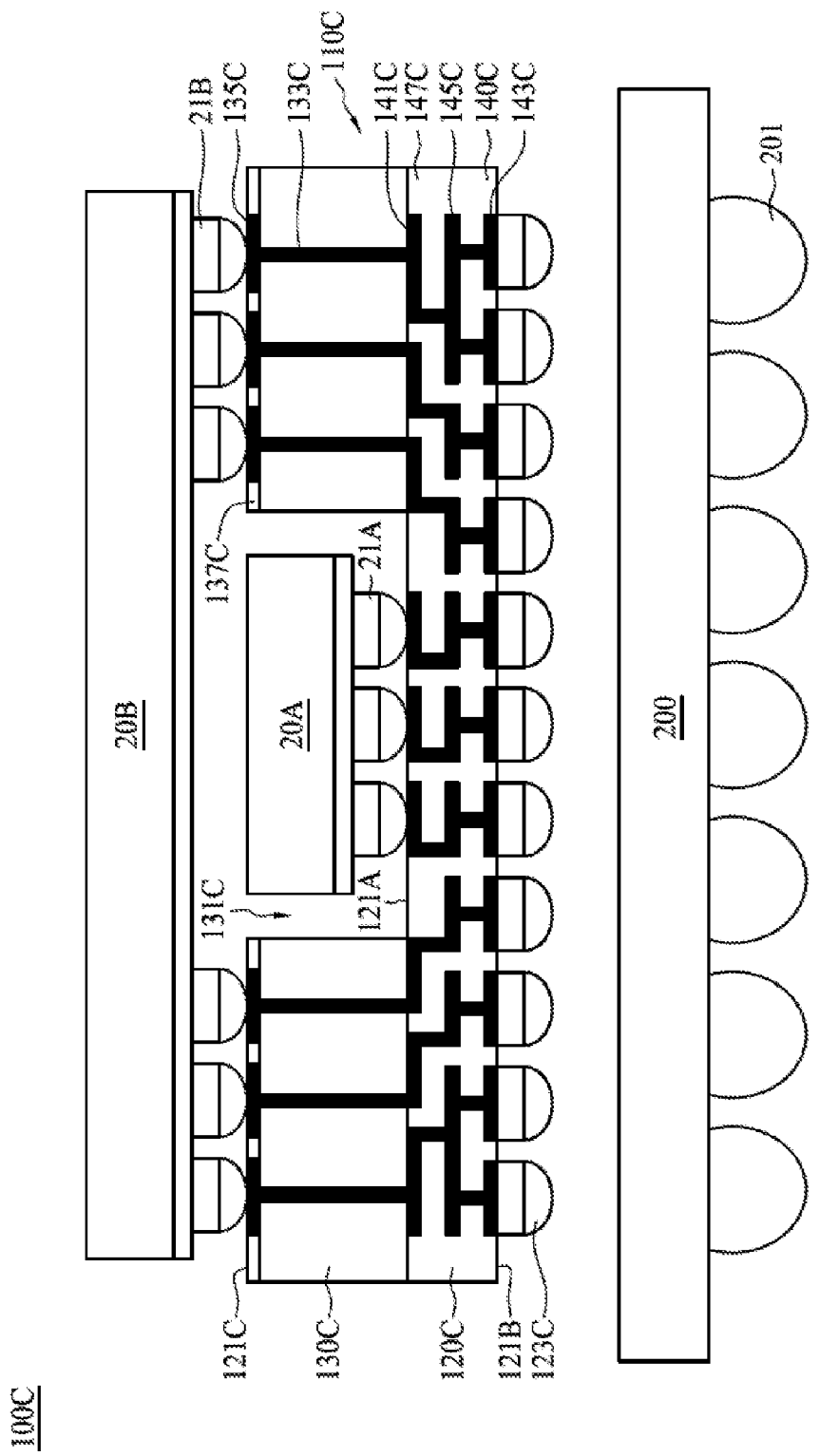
FIG. 3 is a cross-sectional view of a semiconductor package in accordance with some embodiments of the present disclosure.

FIG. 3 is a cross-sectional view of a semiconductor package 100C in accordance with some embodiments of the present disclosure. In some embodiments, the semiconductor package 100C comprises an interposer 110C, a first semiconductor die 20A bonded to a first side 121A on a first side of the interposer 110C, an object 200 bonded to a second side 121B on a second side of the interposer 110C, and a second semiconductor die 20B bonded to a third side 121C of the interposer 110C, wherein the first side 121A and the third side 121C are opposite to the second side 121B. In some embodiments, the first semiconductor die 20A and the second semiconductor die 20B include integrated circuit devices, such as transistors and diodes; in addition, the first semiconductor die 20A and the second semiconductor die 20B can be the same type of semiconductor die or a different type of semiconductor die.

In some embodiments, the interposer 110C comprises a substrate portion 120C and a wall portion 130C disposed on the substrate portion 120C; the substrate portion 120C has an electrical interconnect structure 140C between the first side 121A and the second side 121B, and the substrate portion 120C is substantially free from integrated circuit devices, such as transistors, diodes and conductive through vias; and the wall portion 130C is disposed on the first side 121A and defining an aperture 131C exposing a portion of the first side 121A.

In some embodiments, the interconnect structure 140C comprises one or more dielectric layers 147C, at least one first conductive terminal 141C disposed on the first side 121A, at least one second conductive terminal 143C disposed on the second side 121B, and at least one conductive line 145C electrically connects the at least one first conductive terminal 141C and the at least one second conductive terminal 143C.

In some embodiments, the first side 121A includes, but not limited to, the upper surface of the interposer 110C facing the semiconductor die 20A and the space above the upper surface; similarly, the second side 121B includes, but not limited to, the lower surface of the interposer 110C facing the object 200 and the space below the lower surface. In some embodiments, the third side 121C includes, but not limited to, the upper surface of the wall portion 130C facing the semiconductor die 20B and the space above the upper surface.

In some embodiments, the third side 121C is above the first side 121A of the substrate portion 120C, and the wall portion 130C has at least one conductive through via 133C penetrating through the wall portion 130C. In some embodiments, the interposer 110C further comprises at least one third conductive terminal 135C disposed on the third side 121C, and the at least one conductive through via 133C electrically connects the at least one third conductive terminal 135C to the electrical interconnect structure 140C. In some embodiments, the interposer 110C comprises a plurality of third conductive terminals 135C separated by dielectric patterns 137C, such as oxide patterns.

In some embodiments, the interposer 110C comprises a plurality of conductive joints 123C on the second side 121B, and the object 200 is bonded to the conductive joints 123C. In some embodiments, the first semiconductor die 20A includes at least one conductive joint 21A, and the conductive joint 21A is bonded to the first conductive terminal 141C in the aperture 131C on the first side 121A of the substrate portion 120C. In some embodiments, the second semiconductor die 20B includes at least one conductive joint 21B, and the conductive joint 21B is bonded to the third conductive terminal 135C on the third side 121C of the wall portion 130C. In some embodiments, the first semiconductor die 20A is disposed in the aperture 131C of the interposer 110C, and the second semiconductor die 20B is disposed above the first semiconductor die 20A.

In some embodiments, the first semiconductor die 20A is embedded in the aperture 131C of the interposer 110C, rather than being disposed on top of the interposer 110C and adjacent to the second semiconductor die 20B. Consequently, the height or width of the semiconductor package 100C is lower than the design of being disposed on top of the interposer 110C, i.e., the semiconductor package 100B has a smaller form factor. In addition, the cost for fabricating through silicon vias (TSV) is very expensive, and the fabrication of the interposer 110C does not include forming through silicon vias (TSV) for electrically connecting the first semiconductor die 20A to the electrical interconnect structure 140C; therefore, the fabrication cost of the interposer 110C can be dramatically reduced.

Figure 4:
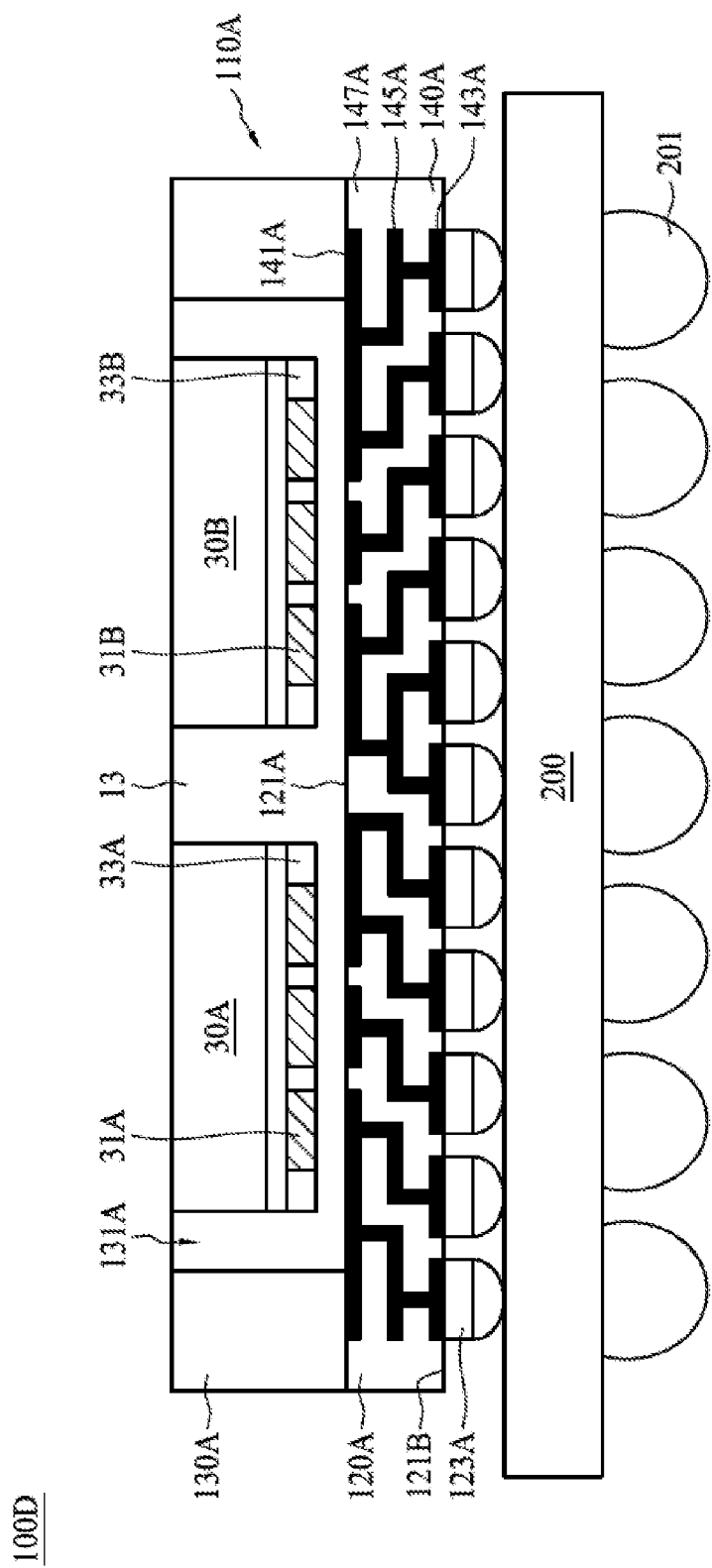
FIG. 4 is a cross-sectional view of a semiconductor package in accordance with some embodiments of the present disclosure.

FIG. 4 is a cross-sectional view of a semiconductor package 100D in accordance with some embodiments of the present disclosure. The semiconductor package 100D shown in FIG. 4 is substantially the same as the semiconductor package 100A shown in FIG. 1, except that the semiconductor package 100D comprises a first semiconductor die 30A having conductive terminals 31A separated by dielectric patterns 33A, such as oxide patterns, and a second semiconductor die 30B having conductive terminals 31B separated by dielectric patterns 33B, such as oxide patterns. In some embodiments, the first semiconductor die 30A and the second semiconductor die 30B are bonded to the interposer 120A through a fusion bonding (oxide-to-oxide bond), wherein the dielectric patterns 33A, 33B are respectively bonded to the dielectric blocks of the dielectric layer 147A between the first conductive terminals 141A of the electrical interconnect structure 140A, and the conductive terminals 31A, 31B respectively connect the first conductive terminals 141A of the electrical interconnect structure 140A.

Figure 5:
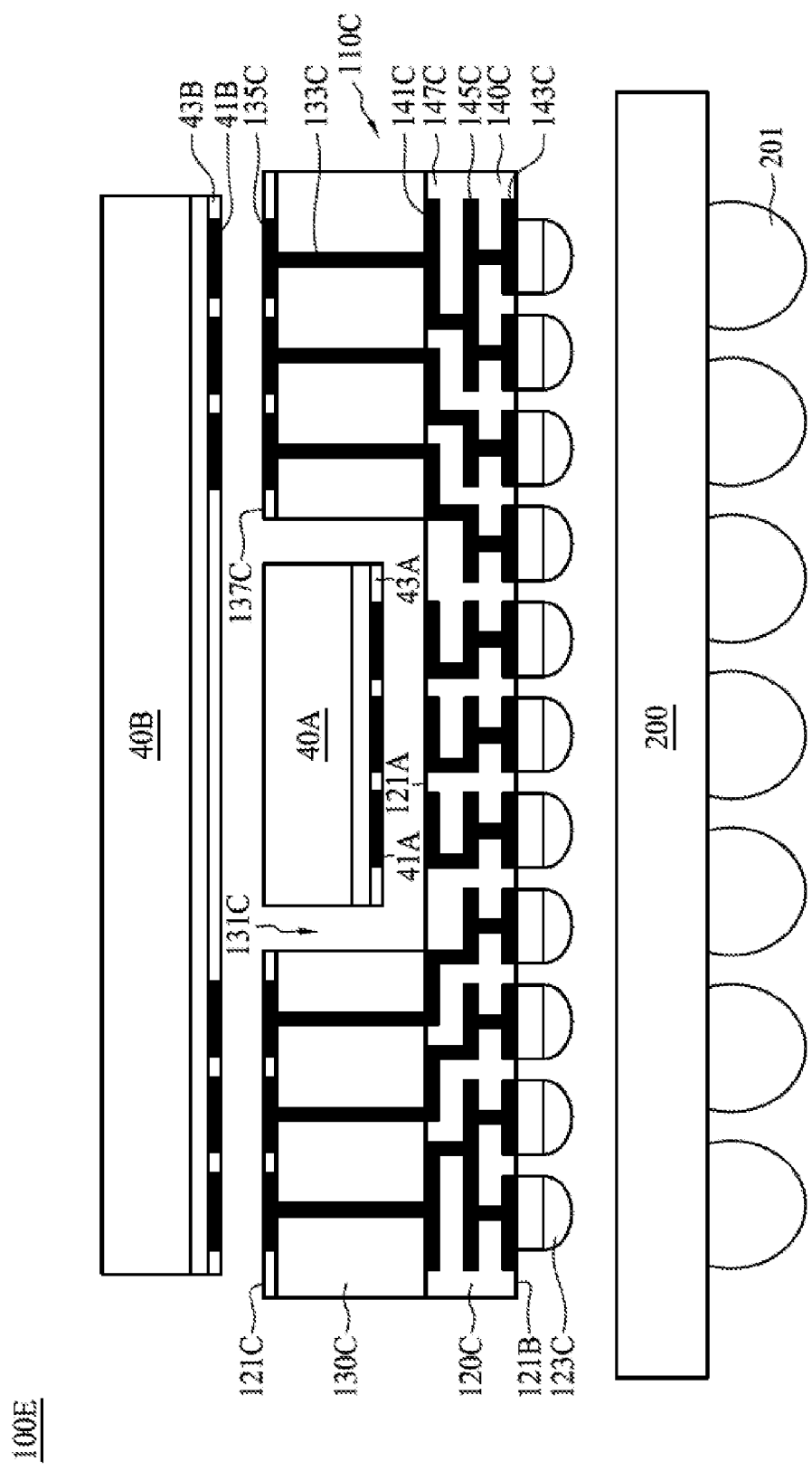
FIG. 5 is a cross-sectional view of a semiconductor package in accordance with some embodiments of the present disclosure.

FIG. 5 is a cross-sectional view of a semiconductor package 100E in accordance with some embodiments of the present disclosure. The semiconductor package 100E shown in FIG. 5 is substantially the same as the semiconductor package 100C shown in FIG. 3, except that the semiconductor package 100E comprises a first semiconductor die 40A having conductive terminals 41A separated by dielectric patterns 43A, such as oxide patterns, and a second semiconductor die 40B having conductive terminals 41B separated by dielectric patterns 43B, such as oxide patterns. In some embodiments, the first semiconductor die 40A and the second semiconductor die 40B are bonded to the interposer 110C through a fusion bonding (oxide-to-oxide bond), wherein the dielectric patterns 43A is bonded to the dielectric blocks of the dielectric layer 147C between the first conductive terminals 141C of the electrical interconnect structure 140C, and the conductive terminals 41A electrically connects the first conductive terminals 141C of the electrical interconnect structure 140C. Similarly, the dielectric patterns 43B is bonded to the dielectric patterns 137C on the wall portion 130C, and the conductive terminals 41B electrically connects the third conductive terminals 135C separated by dielectric patterns 137C.

FIGS. 6-10 are cross-sectional views showing the fabrication of a semiconductor package 100A in accordance with some embodiments of the present disclosure.

Figure 6:
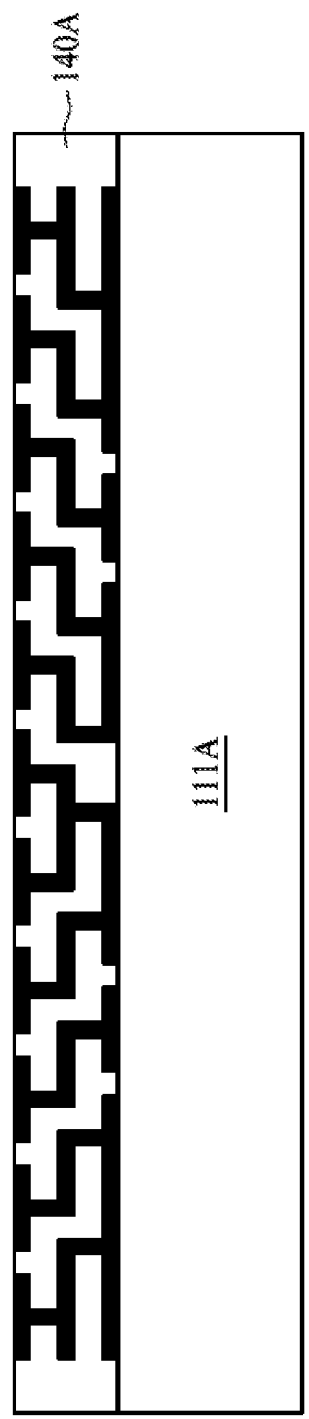
FIGS. 6-10 are cross-sectional views showing the fabrication of a semiconductor package in accordance with some embodiments of the present disclosure.

Referring to FIG. 6, an electrical interconnect structure 140A is formed on one side of a semiconductor substrate 111A, such as a silicon substrate, by fabrication processes including deposition, lithographic and etching processes.

Figure 7:
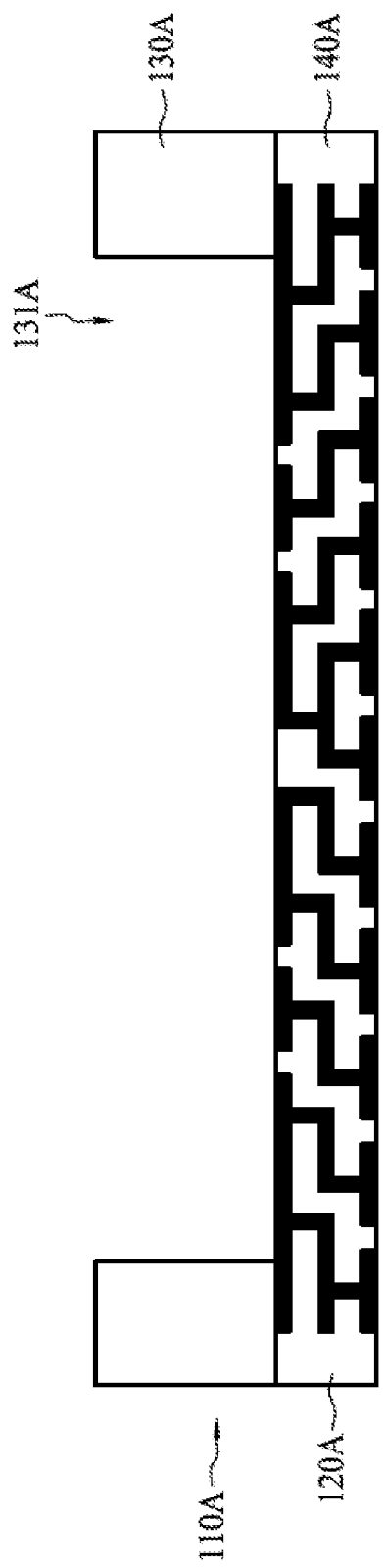

Referring to FIG. 7, a portion of the semiconductor substrate 111A is removed by fabrication processes including lithographic and etching processes, such as an anisotropic dry etching, performed on a back side of the semiconductor substrate 111A so as to form an interposer 110A with an aperture 131A exposing the electrical interconnect structure 140A. The electrical interconnect structure 140A serves as a substrate portion 120A, and the remaining semiconductor substrate 111A forms a wall portion 130A on the substrate portion 120A.

Figure 8:
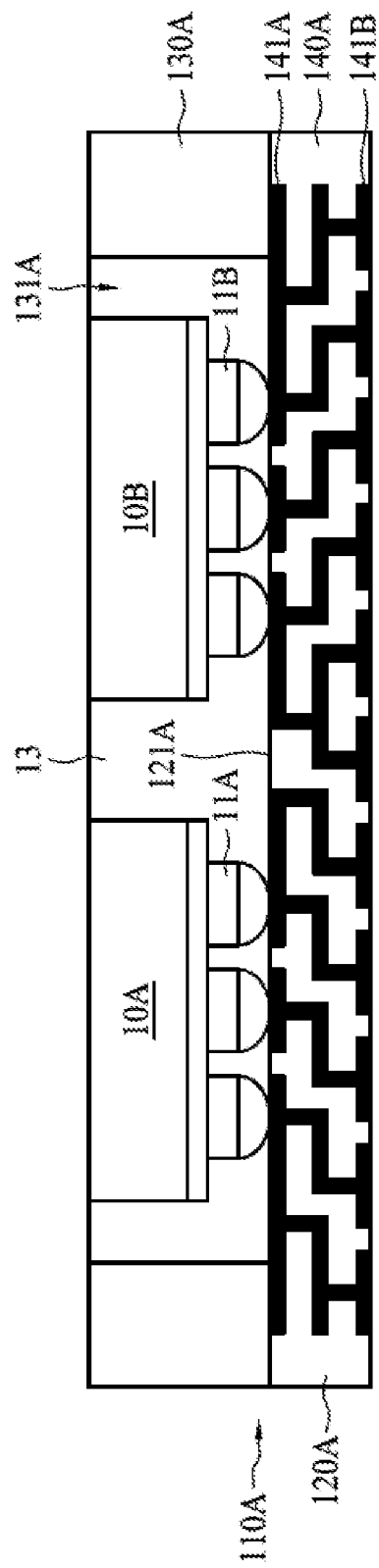

Referring to FIG. 8, the aperture 131A defined by the wall portion 130A is filled with a nonconductive film/paste (NCF/NCP) 13, and a first semiconductor die 10A and a second semiconductor die 10B are bonded to the electrical interconnect structure 140A in the aperture 131A. The first semiconductor die 10A includes at least one conductive joint 11A, the second semiconductor die 10B includes at least one conductive joint 11B, and the conductive joints 11A, 11B are respectively bonded to the first conductive terminals 141A of the electrical interconnect structure 140A on the first side 121A of the substrate portion 120A.

Figure 9:
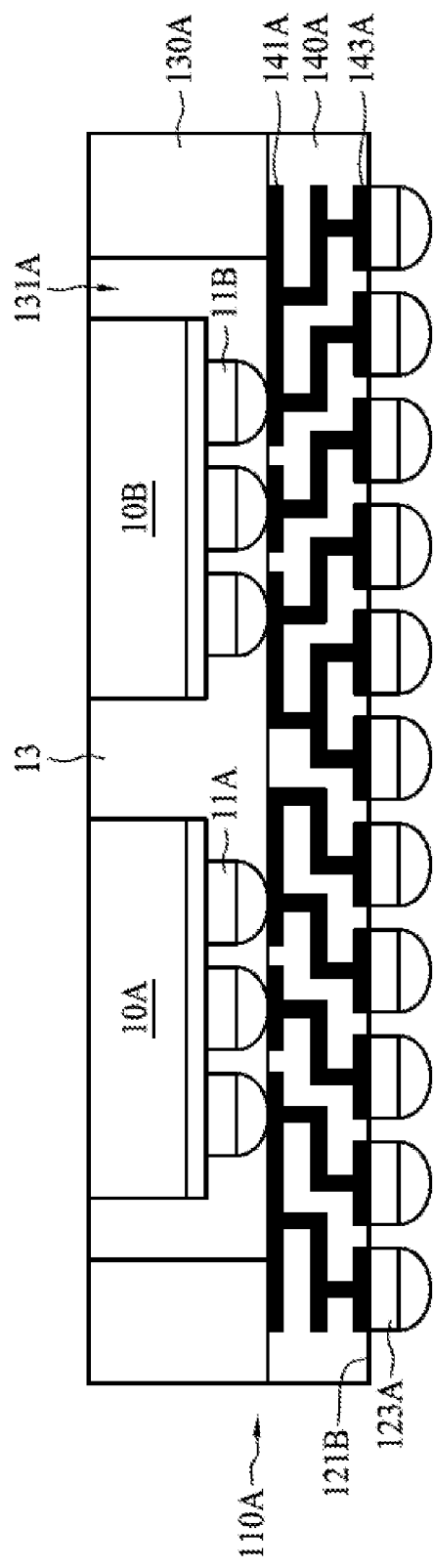

Referring to FIG. 9, a plurality of conductive joints 123A, such as conductive bumps, are formed on one side of the interposer 110A opposite to the side where the first semiconductor die 10A and the second semiconductor die 10B are bonded. The conductive joints 123A are formed on the second conductive terminals 143A disposed on the second side 121B of the interposer 110A.

Figure 10:
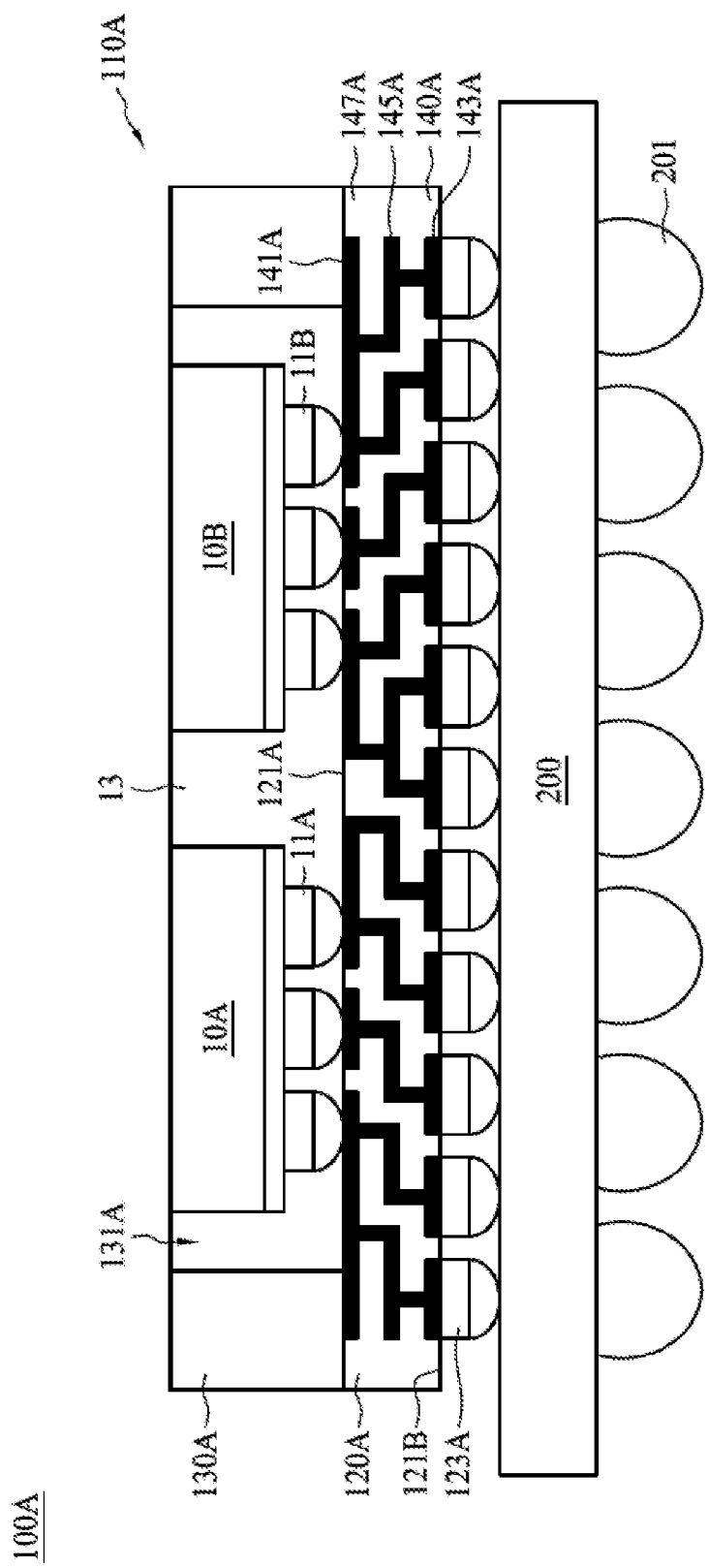

Referring to FIG. 10, an object 200 is bonded to one side of the interposer 110A via the conductive joints 123A so as to complete the semiconductor package 100A, wherein the object 200 is bonded to one side of the interposer 110A opposite to the side where the first semiconductor die 10A and the second semiconductor die 10B are bonded.

FIGS. 11-16 are cross-sectional views showing the fabrication of a semiconductor package 100B in accordance with some embodiments of the present disclosure.

Figure 11:
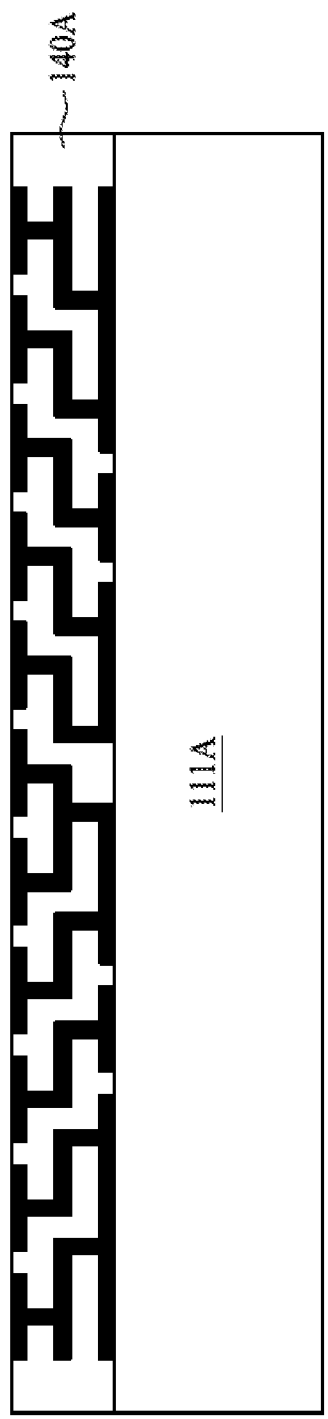
FIGS. 11-16 are cross-sectional views showing the fabrication of a semiconductor package in accordance with some embodiments of the present disclosure.

Referring to FIG. 11, an electrical interconnect structure 140A is formed on one side of a semiconductor substrate 111A, such as a silicon substrate, by fabrication processes including deposition, lithographic and etching processes.

Figure 12:
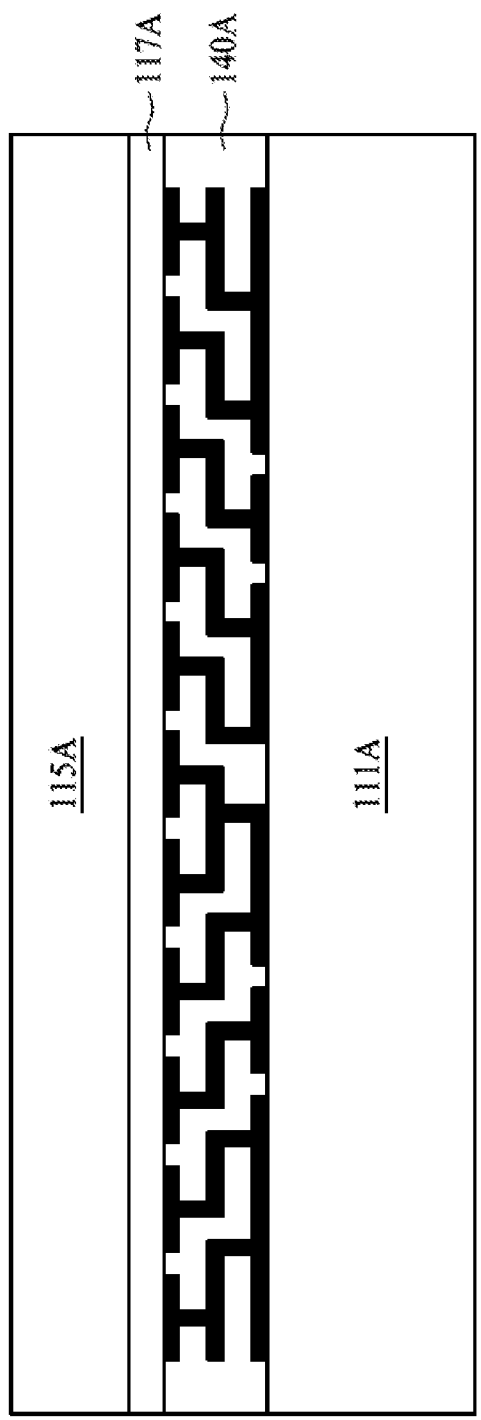

Referring to FIG. 12, a temporary carrier 115A is bonded to one side of the electrical interconnect structure 140A via an adhesive layer 117A.

Figure 13:
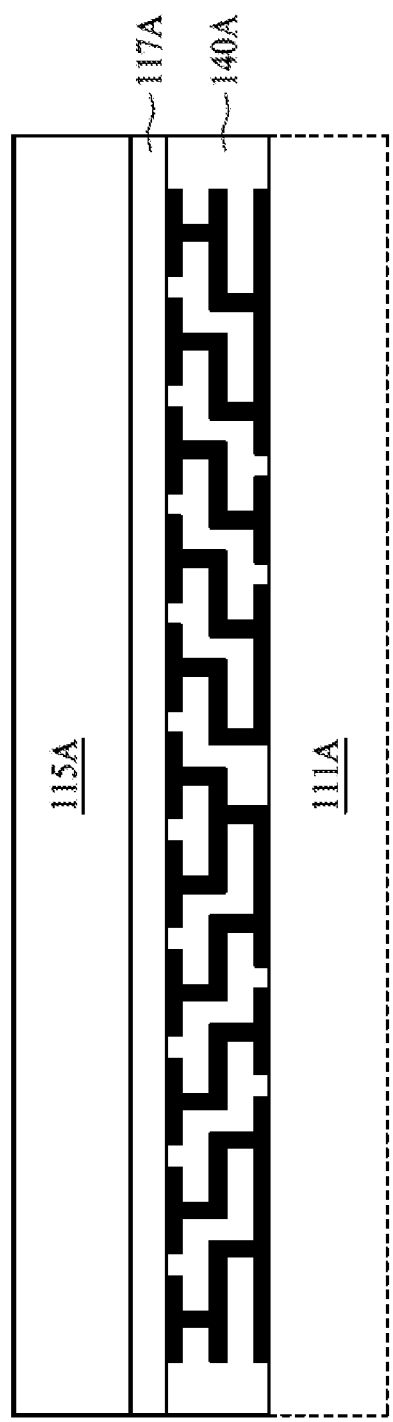

Referring to FIG. 13, the semiconductor substrate 111A is removed by etching or grinding so as to expose one side of the electrical interconnect structure 140A. The exposed side of the electrical interconnect structure 140A is opposite to the side where the temporary carrier 115A is bonded.

Figure 14:
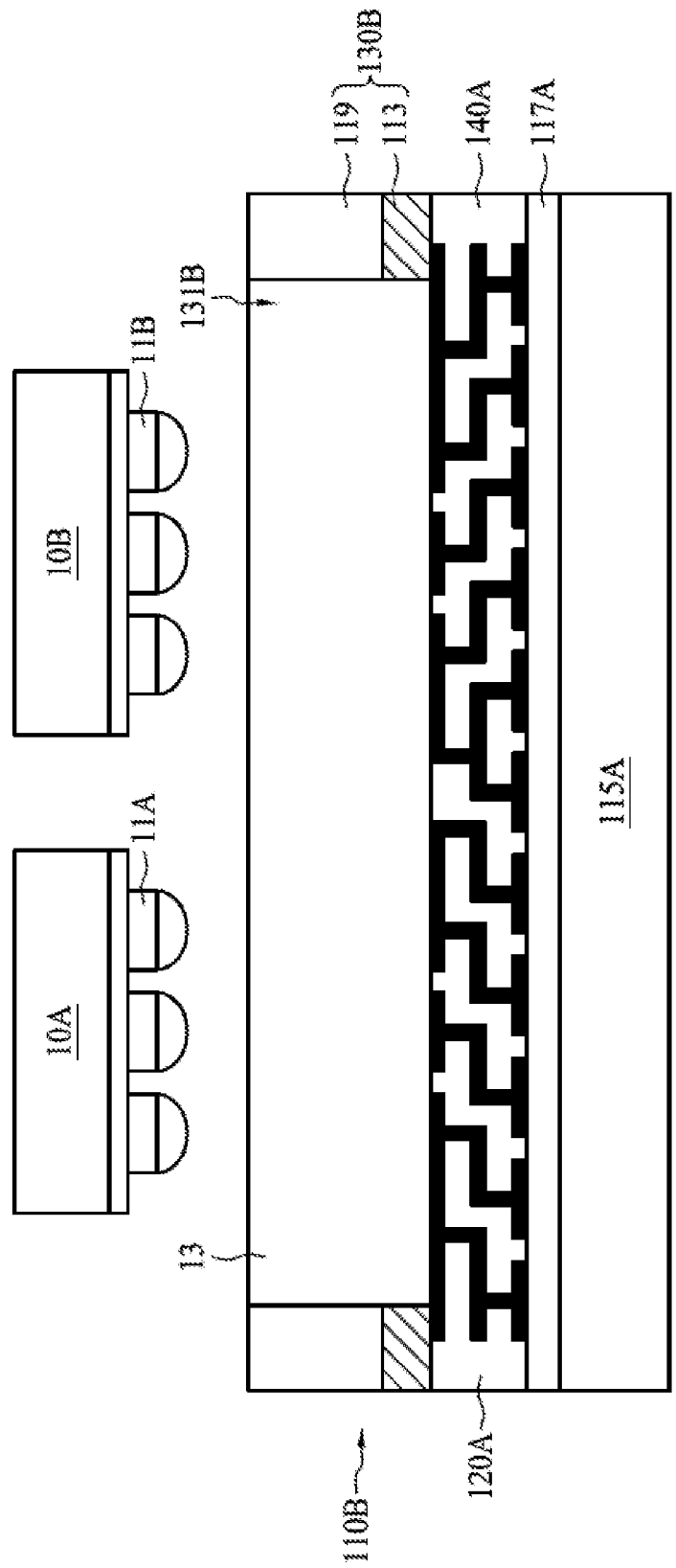

Referring to FIG. 14, an intervening layer 113, such as an adhesive layer, is formed on the exposed side of the electrical interconnect structure 140A, and a stiffener 119 of silicon or glass is disposed on the intervening layer 113 to form an interposer 110B with an aperture 131B exposing the electrical interconnect structure 140A. The electrical interconnect structure 140A serves as a substrate portion 120A, the intervening layer 113 and the stiffener 119 form a wall portion 130B on the substrate portion 120A, and the aperture 131B is defined by the wall portion 130B.

Subsequently, the aperture 131B defined by the wall portion 130B is filled with a nonconductive film/paste (NCF/NCP) 13, and a first semiconductor die 10A and a second semiconductor die 10B are bonded to the electrical interconnect structure 140A in the aperture 131B. The first semiconductor die 10A includes at least one conductive joint 11A, the second semiconductor die 10B includes at least one conductive joint 11B, and the conductive joints 11A, 11B are respectively bonded to the first conductive terminals 141A of the electrical interconnect structure 140A in the aperture 131B.

Figure 15:
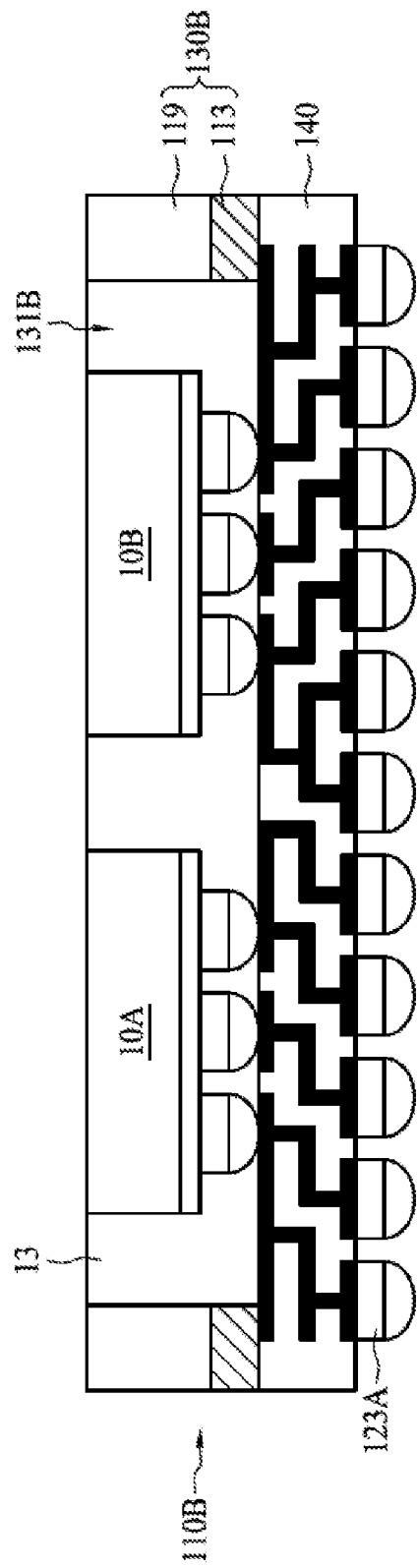

Referring to FIG. 15, the temporary carrier 115A and the adhesive layer 117A are removed from the electrical interconnect structure 140A, and a plurality of conductive joints 123A, such as conductive bumps, are formed on one side of the interposer 110B opposite to the side where the first semiconductor die 10A and the second semiconductor die 10B are bonded.

Figure 16:
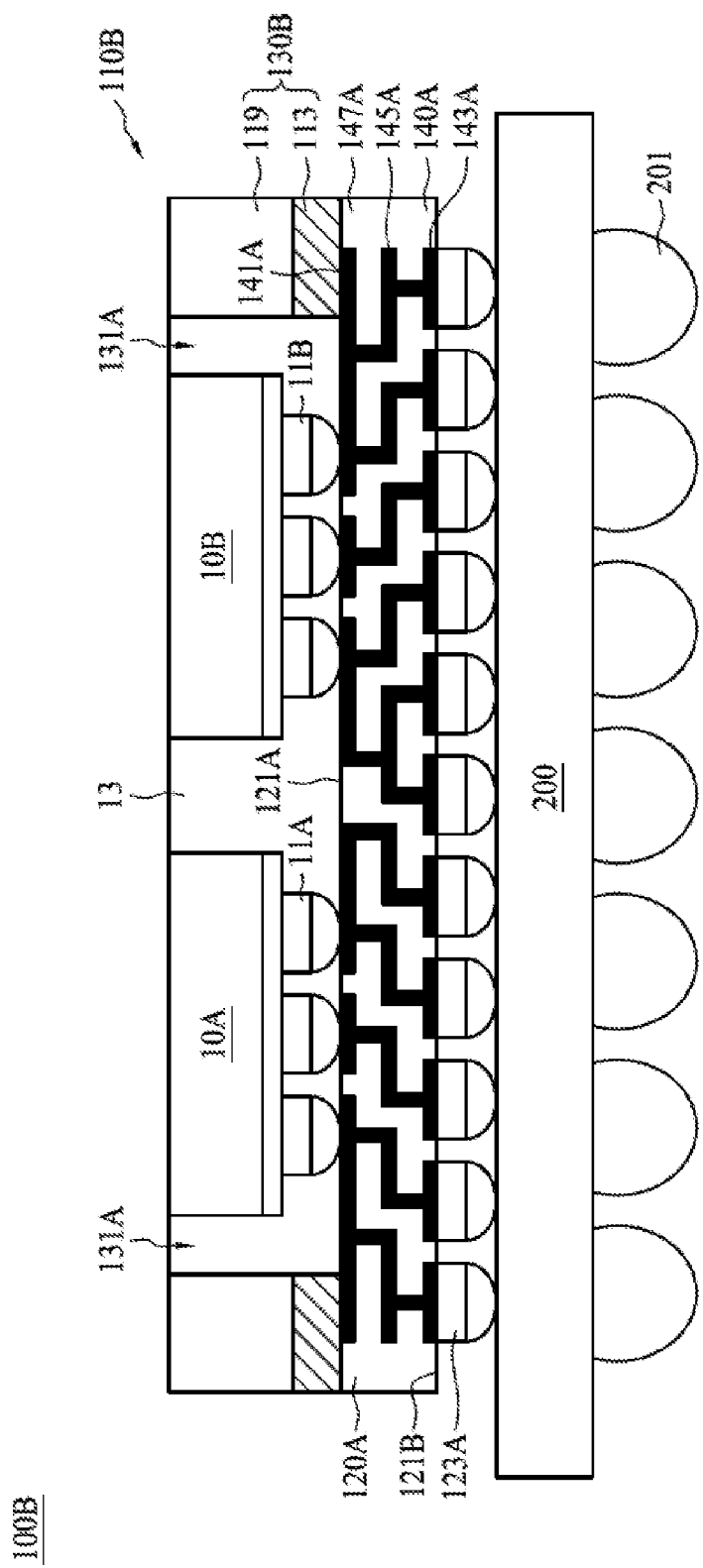

Referring to FIG. 16, an object 200 is bonded to the interposer 110B via the conductive joints 123A so as to complete the semiconductor package 100B, wherein the object 200 is bonded to one side of the interposer 110B opposite to the side where the first semiconductor die 10A and the second semiconductor die 10B are bonded.

FIGS. 17-22 are cross-sectional views showing the fabrication of a semiconductor package 100C in accordance with some embodiments of the present disclosure.

Figure 17:
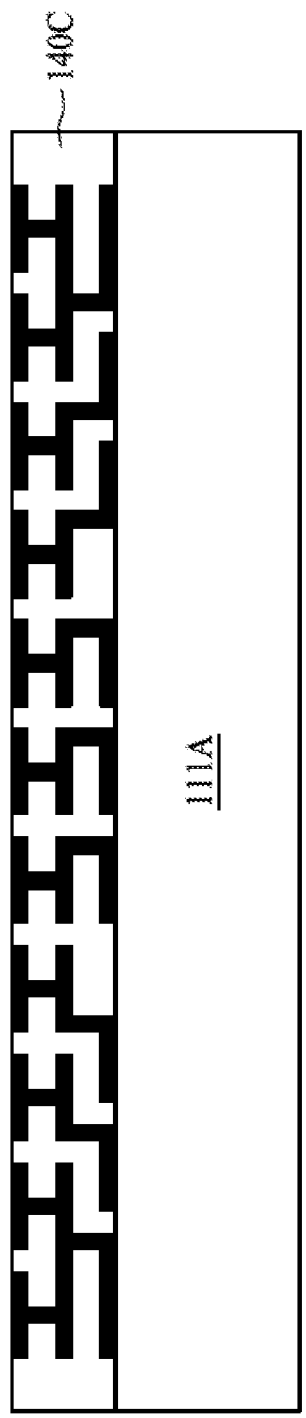
FIGS. 17-22 are cross-sectional views showing the fabrication of a semiconductor package in accordance with some embodiments of the present disclosure.

Referring to FIG. 17, an electrical interconnect structure 140C is formed on one side of a semiconductor substrate 111A, such as a silicon substrate, by fabrication processes including deposition, lithographic and etching processes.

Figure 18:
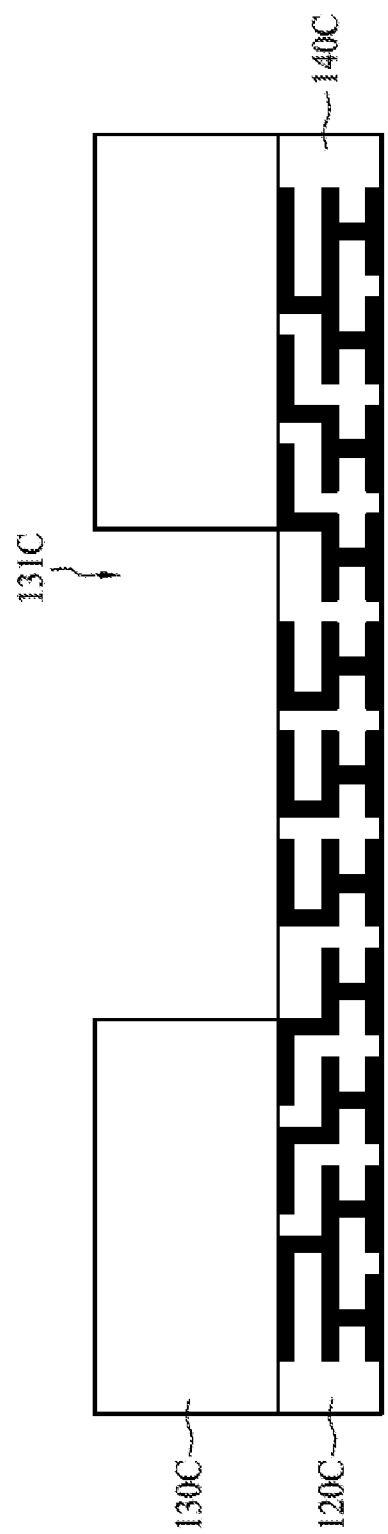

Referring to FIG. 18, a portion of the semiconductor substrate 111A is removed by fabrication processes including lithographic and etching processes, such as an anisotropic dry etching, performed on another side of the semiconductor substrate 111A so as to form an aperture 131C exposing the electrical interconnect structure 140C. The electrical interconnect structure 140C serves as a substrate portion 120C, and the remaining semiconductor substrate 111A forms a wall portion 130C on the substrate portion 120C.

Figure 19:
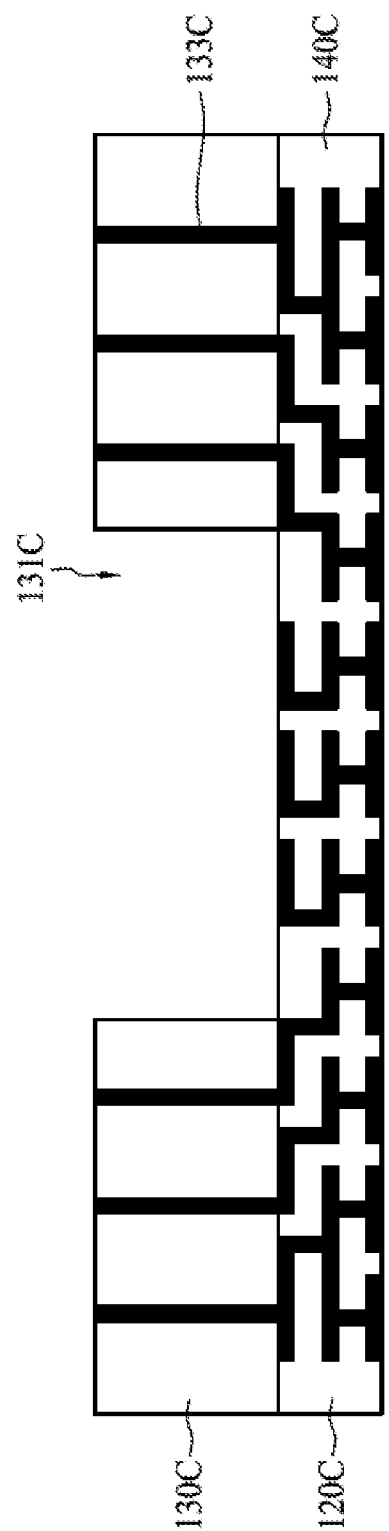

Referring to FIG. 19, a plurality of conductive through vias 133C are formed in the wall portion 130C by fabrication processes including lithographic, etching and deposition processes.

Figure 20:
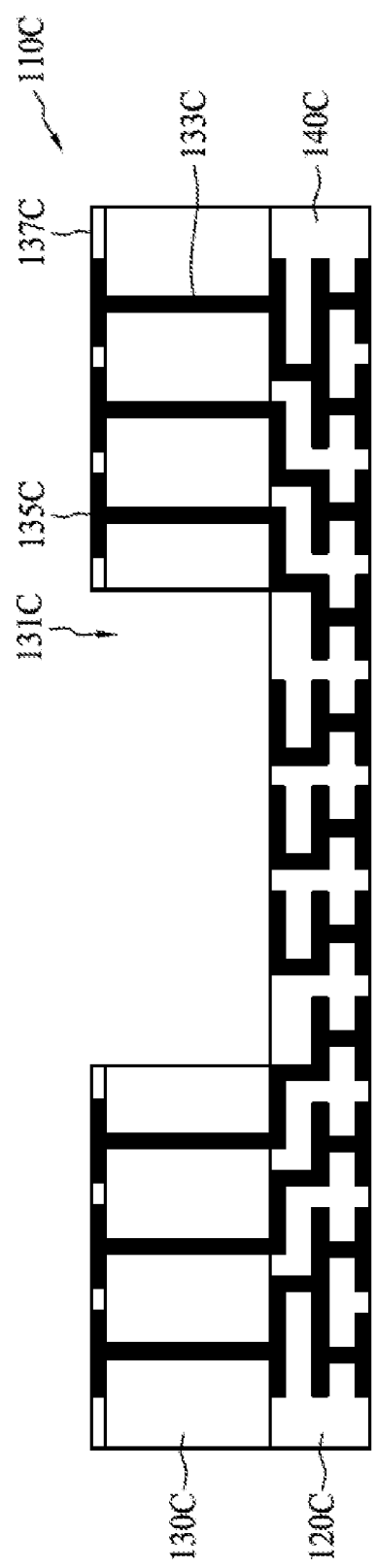

Referring to FIG. 20, a plurality of third conductive terminals 135C separated by dielectric patterns 137C, such as oxide patterns, are formed on an upper surface of the wall portion 130C so as to form an interposer 110C, by fabrication processes including deposition, lithographic and etching processes. The plurality of third conductive terminals 135C are formed on top of the conductive through vias 133C, which electrically connect the third conductive terminal 135C to the electrical interconnect structure 140C.

Figure 21:
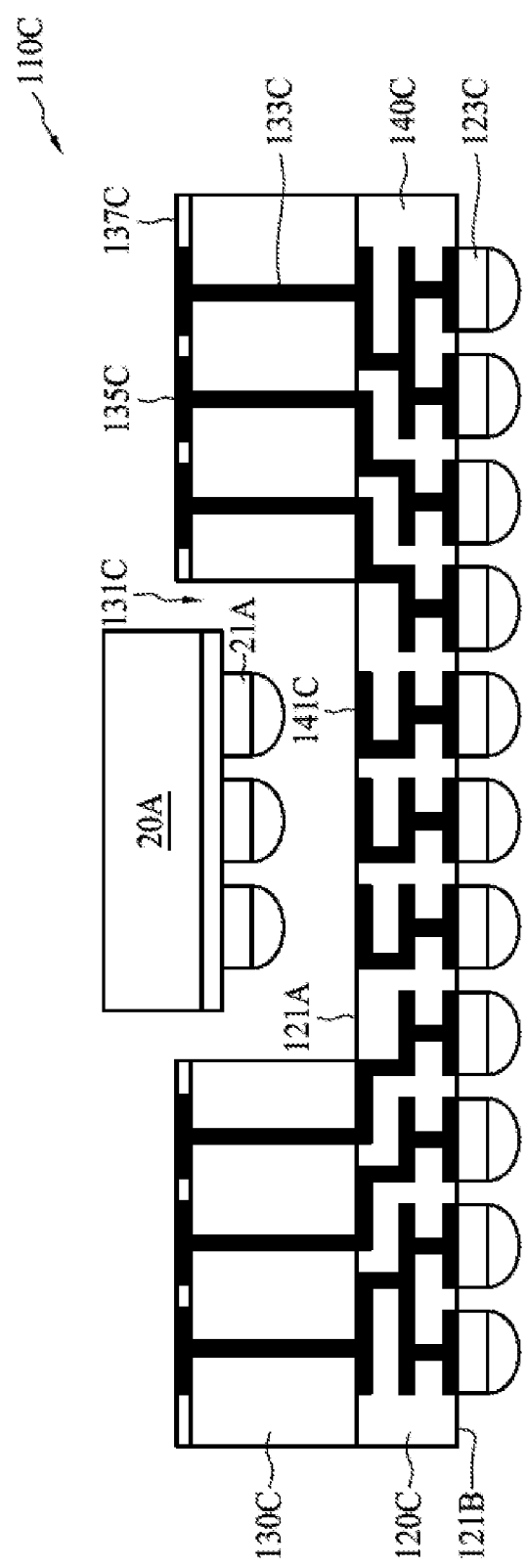

Referring to FIG. 21, a first semiconductor die 20A is bonded to the electrical interconnect structure 140C in the aperture 131C. The first semiconductor die 20A includes conductive joints 21A, and the conductive joints 21A are bonded to the first conductive terminals 141C of the electrical interconnect structure 140C on the first side 121A of the substrate portion 120C. In addition, a plurality of conductive joints 123C, such as conductive bumps, are formed on the second side 121B at one side of the interposer 110C opposite to the side where the first semiconductor die 20A is bonded.

Figure 22:
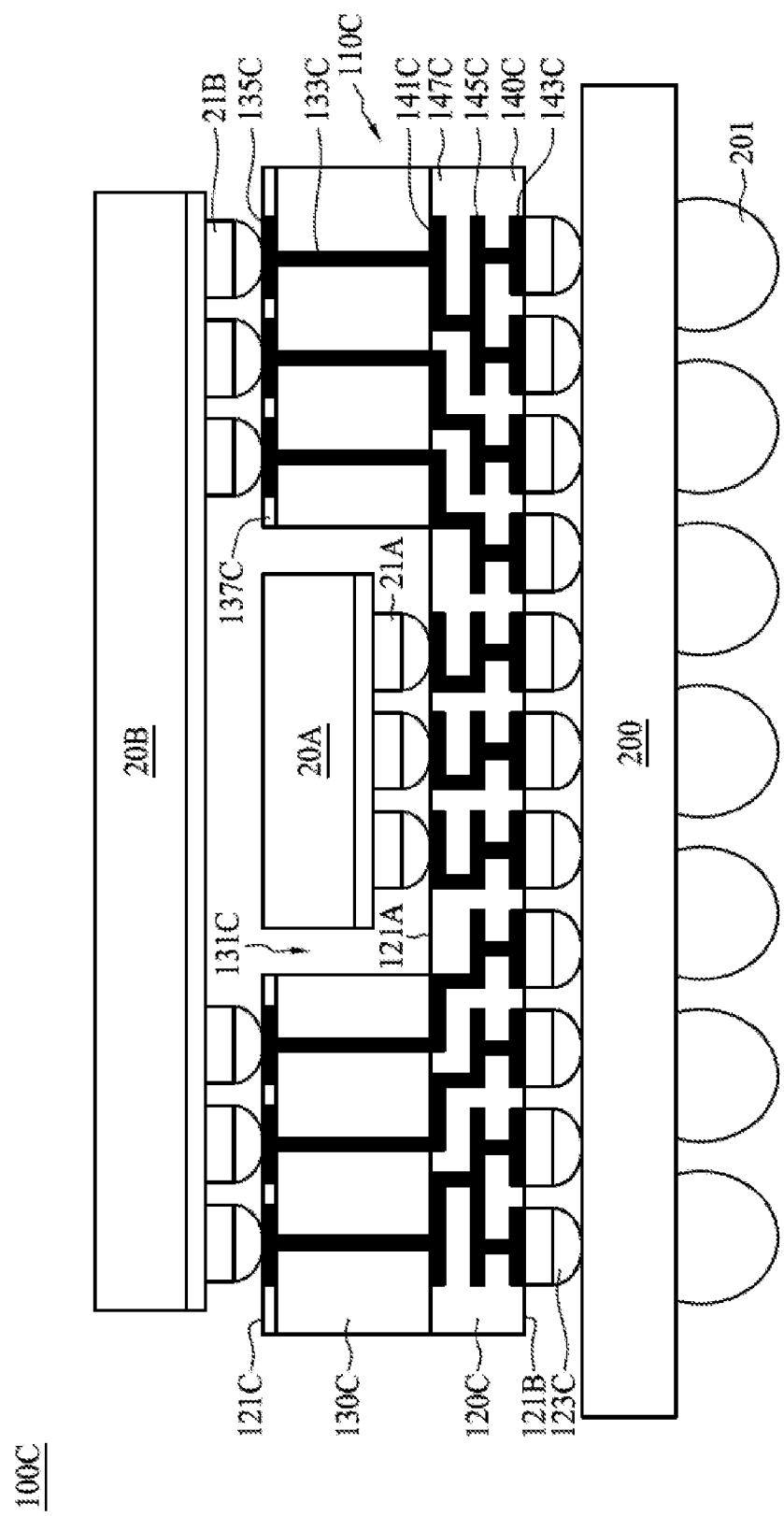

Referring to FIG. 22, a second semiconductor die 20B is bonded to the third conductive terminal 135C on the upper surface of the wall portion 130C via conductive joints 21B, and an object 200 is bonded to the interposer 110C via the conductive joints 123C so as to form the semiconductor package 100C.

One aspect of the present disclosure provides an interposer for a semiconductor package. In some embodiments, the interposer includes a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing a portion of the electrical interconnect structure.

Another aspect of the present disclosure provides a semiconductor package. In some embodiments, the semiconductor package includes an interposer and at least one first semiconductor die bonded to the interposer. In some embodiments, the interposer includes a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing t a portion of the electrical interconnect structure. In some embodiments, the at least one first semiconductor die is disposed in the aperture of the interposer.

Another aspect of the present disclosure provides a method for preparing a semiconductor package. In some embodiments, the method for preparing a semiconductor package includes the steps of providing an interposer and bonding at least one first semiconductor die to the interposer. In some embodiments, the interposer includes a substrate portion and a wall portion disposed on the substrate portion; the substrate portion has a first side, a second side, and an electrical interconnect structure between the first side and the second side, wherein the substrate portion is substantially free from conductive through vias; and the wall portion is disposed on the first side and defining an aperture exposing a portion of the electrical interconnect structure. In some embodiments, the at least one first semiconductor die is disposed in the aperture of the interposer.

In some embodiments, the semiconductor die can be embedded in the aperture of the interposer, rather than being disposed on top of the interposer. Consequently, the height of the semiconductor package is lower than the design of disposing the semiconductor die on top of the interposer, i.e., the semiconductor package has a smaller form factor. In addition, the cost for fabricating through silicon vias (TSV) is very expensive, and the fabrication of the interposer does not include forming through silicon vias (TSV); therefore, the fabrication cost of the interposer can be dramatically reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interposer for a semiconductor package, comprising:
    a substrate portion having a first side, a second side, and an electrical interconnect structure between the first side and the second side, wherein the substrate portion is substantially free from conductive through vias; and
    a wall portion disposed on the first side and defining an aperture exposing a portion of the electrical interconnect structure, wherein the wall portion comprises an intervening layer disposed on the substrate portion and a stiffener disposed on the intervening layer, the intervening layer and the stiffener having a same width.

2. The interposer for a semiconductor package of claim 1, wherein the electrical interconnect structure comprises:
   at least one first conductive terminal disposed on the first side;
   at least one second conductive terminal disposed on the second side; and
   at least one conductive line electrically connects the at least one first conductive terminal and the at least one second conductive terminal.

3. The interposer for a semiconductor package of claim 1, wherein the substrate portion and the wall portion are formed of different materials.

4. The interposer for a semiconductor package of claim 1, wherein the wall portion has a third side above the first side of the substrate portion, and the wall portion has at least one conductive through via penetrating through the wall portion.

5. The interposer for a semiconductor package of claim 4, further comprising at least one third conductive terminal disposed on the third side, and the at least one conductive through via electrically connects the at least one third conductive terminal to the interconnect structure.

6. The interposer for a semiconductor package of claim 5, comprising a plurality of third conductive terminals separated by dielectric material on top of the wall portion.

7. A semiconductor package, comprising:
   an interposer comprising:
      a substrate portion having a first side, a second side, and an electrical interconnect structure between the first side and the second side, wherein the substrate portion is substantially free from conductive through vias; and
      a wall portion disposed on the first side and defining an aperture exposing a portion of the electrical interconnect structure; and
      at least one first semiconductor die bonded to the interposer and disposed in the aperture,
   wherein the wall portion comprises an intervening layer disposed on the substrate portion and a stiffener disposed on the intervening layer, the intervening layer and the stiffener having a same width.

8. The semiconductor package of claim 7, wherein the electrical interconnect structure comprises:
   at least one first conductive terminal disposed on the first side, wherein the at least one first semiconductor die is electrically connected to the at least one first conductive terminal;
   at least one second conductive terminal disposed on the second side; and
   at least one conductive line electrically connects the at least one first conductive terminal and the at least one second conductive terminal.

9. The semiconductor package of claim 7, wherein the substrate portion and the wall portion are formed of different materials.

10. The semiconductor package of claim 7, wherein the wall portion has a third side above the first side of the substrate portion, and the wall portion has at least one conductive through via penetrating through the wall portion.

11. The semiconductor package of claim 10, further comprising at least one third conductive terminal disposed on the third side, and the at least one conductive through via electrically connects the at least one third conductive terminal to the interconnect structure.

12. The semiconductor package of claim 11, comprising a plurality of third conductive terminals separated by dielectric material on top of the wall portion.

13. The semiconductor package of claim 11, further comprising at least one second semiconductor die bonded to the at least one third conductive terminal, and the at least one second semiconductor die is disposed above the at least one first semiconductor die.

14. The semiconductor package of claim 7, further comprising an object bonded to the second side of the interposer.

15. A method for preparing a semiconductor package, comprising the steps of:
   providing an interposer comprising:
      a substrate portion having a first side, a second side, and an electrical interconnect structure between the first side and the second side, wherein the substrate portion is substantially free from conductive through vias; and
      a wall portion disposed on the first side and defining an aperture exposing the first side; and
   bonding at least one first semiconductor die to the interposer and in the aperture,
   wherein the wall portion comprises an intervening layer disposed on the substrate portion and a stiffener disposed on the intervening layer, the intervening layer and the stiffener having a same width.

16. The method for preparing a semiconductor package of claim 15, wherein providing an interposer comprises:
   forming the electrical interconnect structure on a first side of the substrate portion; and
   performing an etching process from a second side of the substrate portion to form the wall portion defining the aperture exposing a portion of the electrical interconnect structure.

17. The method for preparing a semiconductor package of claim 15, wherein providing an interposer comprises:
   forming the electrical interconnect structure on a first side of the substrate portion;
   thinning the substrate portion from a second side of the substrate portion to expose the electrical interconnect structure;
   forming the intervening layer on the second side of the substrate portion; and
   forming the wall portion on the intervening layer and defining the aperture.

18. The method for preparing a semiconductor package of claim 15, wherein providing an interposer comprises forming at least one conductive through via penetrating through the wall portion.

19. The method for preparing a semiconductor package of claim 15, wherein the wall portion has a third side above the first side of the substrate portion, the method further comprises forming at least one third conductive terminal on the third side, bonding at least one second semiconductor die to the at least one third conductive terminal, and the at least one second semiconductor die is disposed above the at least one first semiconductor die.

20. The method for preparing a semiconductor package of claim 15, further comprising bonding an object to the interposer.

* * * * *